United States Patent [19]

Sugihara et al.

[11] Patent Number: 5,026,680

[45] Date of Patent: Jun. 25, 1991

[54] METHOD OF MANUFACTURING A POWDER OF BI-BASED SUPERCONDUCTIVE OXIDE CONTAINING LEAD AND METHOD OF MANUFACTURING A SINTERED BODY THEREFROM

[75] Inventors: Tadashi Sugihara; Takuo Takeshita; Yukihiro Ohuchi, all of Ohmiya, Japan

[73] Assignee: Mitsubishi Metal Corporation, Tokyo, Japan

[21] Appl. No.: 390,281

[22] Filed: Aug. 7, 1989

[30] Foreign Application Priority Data

Aug. 11, 1988 [JP] Japan .................................. 63-200408
Aug. 11, 1988 [JP] Japan .................................. 63-200409

[51] Int. Cl.$^5$ ...................... C01B 13/32; C01F 11/02; C01G 29/00; C01G 3/02
[52] U.S. Cl. .......................................... 505/1; 75/232; 75/234; 75/235; 252/521; 419/30; 419/31; 419/37; 423/593; 423/604; 501/123; 505/742; 505/782
[58] Field of Search .......................... 505/782, 1, 742; 75/232, 234, 235; 419/19, 22, 31, 33, 36, 30, 37; 423/593, 604; 501/123

[56] References Cited

U.S. PATENT DOCUMENTS

| | | | |
|---|---|---|---|
| 3,355,282 | 11/1967 | Kudo | 502/341 |
| 3,850,850 | 11/1974 | Collins | 252/465 |
| 4,880,771 | 11/1989 | Cara et al. | 505/1 |
| 4,942,152 | 7/1990 | Itozaki et al. | 505/782 |

FOREIGN PATENT DOCUMENTS 1037465 2/1989 Japan .
1037466 2/1989 Japan .
1126258 5/1989 Japan .

OTHER PUBLICATIONS

Liang, "Structural Characterization of a TlCaBaCu Oxide in . . . ", *Appl. Phys. Lett.*, vol. 53(15), Oct. 10, 1988, pp. 1434-1436.
Sheng, "New 120K Tl-Ca-Ba-Cu-O Superconductor", *Appl. Phys. Lett.*, vol. 52(20), May 16, 1988, pp. 1738-1740.
Sheng, "Superconductivity at 90K in the Tl-Ba-Cu-O System", *Phys. Rev. Lett.*, vol. 60, No. 10, Mar. 7, 1988, pp. 937-940.
Iyer "Insensitivity of Tc to High K Substitution in the Tl-Ba-Cu-Cu-O . . . ", *Physica*, C152, 1988, pp. 505-507.
Gopalakrishnan, "Synthesis and Properties of a 125K Superconductor . . . ", *Appl. Phys. Lett.*, vol. 53(5), Aug. 1, 1988, pp. 414-416.
Ihara, "A New High-Tc TlBa$_2$Ca$_3$Cu$_4$O$_4$ Superconductor with Tc<120K", *Nature*, vol. 334, Aug. 11, 1988.
Hazen, "100-K Superconducting Phases in the Tl-Ca-Ba-Cu-O System", *Phys. Rev. Lett.*, vol. 60(16), Apr. 18, 1988, pp. 1657-1660.

*Primary Examiner*—Paul Lieberman
*Assistant Examiner*—John Boyd
*Attorney, Agent, or Firm*—Frishauf, Holtz, Goodman & Woodward

[57] ABSTRACT

A Ca carbonate powder, a Sr carbonate powder, and a Cu oxide powder are mixed in predetermined proportions, and sintered at a first predetermined temperature into a Ca-Sr-Cu—O oxide sintered body. A Bi oxide powder and a Pb oxide powder are mixed in predetermined proportions, and are sintered at a second predetermined temperature into a Bi—Pb—O oxide sintered body. The obtained Ca—Sr—Cu—O oxide sintered body and Bi—Pb—O oxide sintered body are crushed, and the resulting Ca—Sr—Cu—O oxide powder and Bi—Pb—O oxide powder are mixed in predetermined proportions. The resulting mixed powder is sintered at a third predetermined temperature into a Bi—Pb—Sr—Ca—Cu—O superconductive oxide sintered body, which is crushed into a powder of a Bi-based superconductive oxide containing Pb. A sintered body of the Bi-based superconductive oxide containing Pb is formed from the Bi-based superconductive oxide powder. According to another method, a sintered body of a Bi-based superconductive oxide containing Pb may be manufactured such that a Bi oxide powder and a Pb oxide powder are mixed in predetermined proportions, and sintered at a predetermined temperature into a Bi—Pb—O oxide sintered body. The Bi—Pb—O oxide sintered body is crushed into a powder, followed by mixing the powder with a Bi—Sr—Ca—Cu—O oxide powder in predetermined proportions into a mixed powder. The above Bi-based superconductive oxide sintered body is formed from the last-mentioned mixed powder.

15 Claims, No Drawings

METHOD OF MANUFACTURING A POWDER OF BI-BASED SUPERCONDUCTIVE OXIDE CONTAINING LEAD AND METHOD OF MANUFACTURING A SINTERED BODY THEREFROM

BACKGROUND OF THE INVENTION

This invention relates to a method of manufacturing a powder of Bi-based superconductive oxide containing lead, and a method of manufacturing a sintered body having high density and excellent superconductivity therefrom.

It is conventionally known that a Bi—Sr—Ca—Cu—O oxide (hereinafter referred to as "Bi-based oxide" unless otherwise specified) formed of bismuth (Bi), strontium (Sr), calcium (Ca), copper (Cu), and oxide (O) exhibits superconductivity at a temperature equal to or higher than the boiling point of liquid nitrogen. However, the known Bi-based oxide is formed by two coexisting phases, i.e., a low temperature phase having a critical temperature (Tc) of 75° K. at which it exhibits superconductivity (hereinafter merely called "critical temperature") and a high temperature phase having a critical temperature of 105° K. It has been difficult to form a superconductive oxide having the high temperature phase alone.

Under the above circumstances, it has recently been found that a Bi—Pb—Sr—Ca—Cu—O oxide (hereinafter referred to as "Bi-based oxide containing Pb" unless otherwise specified) having a high temperature phase (Tc = 105° K.) alone can be stably formed by replacing part of Bi by lead (Pb) (see "Abstract of Spring Meeting in 1988" published by "Japan Society of Powder and Powder Metallurgy", page 63). This Bi-based oxide containing Pb is formed by a coprecipitation method or a solid phase reaction method. The coprecipitation method comprises forming coprecipitates in a solution of nitrate or oxalate of Bi, Pb, Sr, Ca, and Cu, thereby obtaining a powder of Bi-based oxide containing Pb. On the other hand, the solid phase reaction method comprises sintering a mixed powder of a Bi oxide powder, a Pb oxide powder, a Ca carbonate powder, a Sr carbonate powder, and a Cu oxide powder at a predetermined temperature into a composite sintered body, and crushing the composite sintered body into a powder of Bi-based oxide containing Pb.

The powder of Bi-based oxide containing Pb thus prepared is pressed into a green compact. The green compact is then sintered at a temperature within a range from 800° to 900° C. under atmospheric pressure, thereby obtaining a sintered body of the Bi-based oxide containing Pb. Alternatively, a sintered body may also be obtained by hot pressing the powder of Bi-based oxide containing Pb at a temperature within a range from 650° to 850° C.

The Bi-based oxide powder obtained by the coprecipitation method has a structure having a high dispersion of elements. Particularly Pb is highly dispersed in Bi such that part of the lattice points of Bi atoms are replaced by Pb atoms evenly throughout the lattice structure. Therefore, the Bi-based oxide obtained by the coprecipitation method has a high temperature phase alone. However, the coprecipitation method takes a long time to form coprecipitates so that it is not suitable for production of a powder of Bi-based superconductive oxide on a commercial scale.

On the other hand, the solid phase reaction method is suitable for mass production of superconductive oxide powder, but has the following disadvantages:

(1) Since the starting powders in the form of solid particles are mixed and sintered, the resulting sintered body has a low degree of dispersion of Pb in Bi, i.e., Bi atoms in the lattice are not replaced by Pb atoms evenly throughout the lattice structure, thus making it difficult to obtain a powder of superconductive oxide having a high temperature phase alone.

(2) Since Pb oxide (PbO) and Bi oxide ($Bi_2O_3$) have low melting points, i.e., approximately 900° C. and 820° C., respectively, sintering must be carried out at a temperature lower than 820° C. in order to prevent melting of these oxides during sintering. However, due to such a low sintering temperature, the resulting sintered body has a degraded superconductivity, a particularly insufficient critical electric current density (Jc), because residual carbon is present in grain boundaries due to decomposition of the Ca carbonate and Sr carbonate of the mixed powders.

(3) There occurs sublimation of a small part of the Pb oxide even during sintering of the mixed powder containing the Pb oxide at a temperature slightly lower than 820° C., so that the resulting sintered body has too low a Pb content to obtain a superconductive oxide sintered body having a high temperature phase alone.

(4) Even if sintering is carried out at the highest possible temperature, i.e., 900° C., the resulting sintered body will have a relative density of 75% at most. Further, the sintering at such a high temperature under atmospheric pressure causes deficiency of oxygen in the resulting sintered body and hence spoils the superconductivity. To recover oxygen, the sintered body has to be subjected to oxygen annealing at a low temperature over a long period of time.

On the other hand, if hot pressing is carried out, the resulting sintered body will have a higher relative density of 90% or more. However, the hot pressing also causes deficiency of oxygen in the sintered body, resulting in degraded superconductivity. To recover oxygen, the sintered body has to be subjected to oxygen annealing for about 100 hours.

The oxygen deficiency can be avoided by atmospheric pressure sintering or hot pressing at a lower temperature than that in the conventional method. However, the resulting sintered body has a low relative density and hence a low critical electric current density, thus failing to exhibit satisfactory superconductivity.

SUMMARY OF THE INVENTION

It is an object of the invention to provide a method of manufacturing a powder of a Bi-based superconductive oxide and a method of manufacturing a sintered body therefrom, which has a low carbon content, high density, and hence high critical current density, as well as a high temperature phase alone and hence a high critical temperature.

A further object of the invention is to provide a method of manufacturing a sintered body of a Bi-based superconductive oxide and a method of manufacturing a sintered body therefrom, which has a low degree of oxygen deficiency, as well as high density even by means of atmospheric pressure sintering or hot pressing at a low temperature.

According to a first aspect of the invention, which is to attain the first-mentioned object, there is provided a method of manufacturing a powder of a Bi-based superconductive oxide containing Pb, comprising the steps of:

(1) mixing a Ca carbonate powder, a Sr carbonate powder, and a Cu oxide powder in predetermined proportions, and sintering the resulting mixed powder at a first predetermined temperature into a sintered body of a Ca—Sr—Cu—O oxide;

(2) mixing a Bi oxide powder and a Pb oxide powder in predetermined proportions, and sintering the resulting mixed powder at a second predetermined temperature into a sintered body of a Bi—Pb—O oxide;

(3) crushing the Ca—Sr—Cu—O oxide sintered body and the Bi—Pb—O oxide sintered body into a Ca—Sr—Cu—O oxide powder and a Bi—Pb—O oxide powder, respectively;

(4) mixing the Ca—Sr—Cu—O oxide powder and the Bi—Pb—O oxide powder in predetermined proportions, and sintering the resulting mixed powder at a third predetermined temperature into a sintered body of a Bi—Pb—Sr—Ca—Cu—O superconductive oxide; and (5) crushing the Bi—Pb—Sr—Ca—Cu—O superconductive oxide sintered body into the powder of the Bi-based superconductive oxide containing Pb.

There is also provided a method of manufacturing a sintered body formed of a Bi-based superconductive oxide containing Pb, comprising the steps of:

(1) mixing a Ca carbonate powder, a Sr carbonate powder, and a Cu oxide powder in predetermined proportions, and sintering the resulting mixed powder at a first predetermined temperature into a sintered body of a Ca—Sr—Cu—O oxide;

(2) mixing a Bi oxide powder and a Pb oxide powder in predetermined proportions, and sintering the resulting mixed powder at a second predetermined temperature into a sintered body of a Bi—Pb—O oxide;

(3) crushing the Ca—Sr—Cu—O oxide sintered body and the Bi—Pb—O oxide sintered body into a Ca—Sr—Cu—O oxide powder and a Bi—Pb—O oxide powder, respectively;

(4) mixing the Ca—Sr—Cu—O oxide powder and the Bi—Pb—O oxide powder in predetermined proportions, and sintering the resulting mixed powder at a third predetermined temperature into a sintered body of a Bi—Pb—Sr—Ca—Cu—O superconductive oxide;

(5) crushing the Bi—Pb—Sr—Ca—Cu—O superconductive oxide sintered body into a powder of the Bi—Pb—Sr—Ca—Cu—O superconductive oxide; and (6) forming the Bi—Pb—Sr—Ca—Cu—O superconductive oxide powder into the sintered body of the Bi-based superconductive oxide containing Pb.

Preferably, the sintered body of the Bi-based superconductive oxide containing Pb may be formed by pressing the Bi—Pb—Sr—Ca—Cu—O superconductive oxide powder into a green compact, and sintering the green compact at a fourth predetermined temperature.

More preferably, the sintered body of Bi-based superconductive oxide containing Pb may be formed by hot pressing the Bi—Pb—Sr—Ca—Cu—O superconductive oxide powder.

There is further provided a method of manufacturing a sintered body formed of a Bi-based superconductive oxide containing Pb, comprising the steps of:

(1) mixing a Ca carbonate powder, a Sr carbonate powder, and a Cu oxide powder in predetermined proportions, and sintering the resulting mixed powder at a first predetermined temperature into a sintered body of a Ca—Sr—Cu—O oxide;

(2) mixing a Bi oxide powder and a Pb oxide powder in predetermined proportions, and sintering the resulting mixed powder at a second predetermined temperature into a sintered body of a Bi—Pb—O oxide;

(3) crushing the Ca—Sr—Cu—O oxide sintered body and the Bi—Pb—O oxide sintered body into a Ca—Sr—Cu—O oxide powder and a Bi—Pb—O oxide powder, respectively; and (4) mixing the Ca—Sr—Cu—O oxide powder and the Bi—Pb—O oxide powder in predetermined proportions, and hot pressing the resulting mixed powder at a third predetermined temperature into the sintered body of the Bi-based superconductive oxide containing Pb.

According to a second aspect of the invention, which is to attain the second-mentioned object, there is provided a method of manufacturing a sintered body formed of a Bi-based superconductive oxide containing Pb, comprising the steps of:

(1) mixing a Bi oxide powder and a Pb oxide powder in predetermined proportions, and sintering the resulting mixed powder at a predetermined temperature into a sintered body of a Bi—Pb—O oxide;

(2) crushing the Bi—Pb—O oxide sintered body into a powder, and mixing the powder with a powder of a Bi—Sr—Ca—Cu—O oxide in predetermined proportions into a mixed powder; and (3) forming the sintered body of the Bi-based superconductive oxide containing Pb from the last-mentioned mixed powder.

Preferably, the sintered body of the Bi-based superconductive oxide containing Pb may be formed by pressing the last-mentioned mixed powder into a green compact, and sintering the green compact.

More preferably, the sintered body of the Bi-based superconductive oxide containing Pb may be formed by hot pressing the last-mentioned mixed powder.

The above and other objects, features, and advantages of the invention will be more apparent from the ensuing detailed description.

DETAILED DESCRIPTION

The present inventors have made many studies in order to improve the conventional solid phase reaction method so as to obtain a sintered body of a Bi-based superconductive oxide containing Pb which has a low carbon content and hence high density and high critical current density, as well as having a high temperature phase alone, and reached the following findings:

(1) If a mixed powder of a $CaCO_3$ powder, a $SrCO_3$ powder, and a CuO powder, which have relatively high melting points, and a mixed powder of a $Bi_2O_3$ powder and a PbO powder, which have relatively low melting points, are sintered separately from each other, the former mixed powder can be sintered at such a high sintering temperature that the carbonates can be decomposed to a sufficient degree to thereby largely reduce the residual carbon and hence obtain high density and high critical current density of the sintered body, whereas the latter mixed powder can be sintered at such a low sintering temperature that no sublimation of the Pb oxide occurs to thereby obtain sufficient dispersion of Pb in Bi and hence a structure having a high temperature phase alone.

Further, the present inventors have also studied how to develop a method of manufacturing a sintered body of a Bi-based superconductive oxide containing Pb, which can provide a sintered body having high density even by sintering under atmospheric pressure or hot pressing at such a low temperature that oxygen deficiency can only occur to a low degree during sintering, and reached the following finding:

(2) If a powder of a Bi—Pb—O oxide is mixed with a powder of a Bi—Sr—Ca—Cu—O oxide, and the mixed powder is subjected to sintering or hot pressing, a sintered body of the Bi-based superconductive oxide containing Pb can be obtained, which has high relative density and hence improved superconductivity, even if the sintering temperature is lower (e.g., lower than 650° C.) than that in the conventional method.

The present invention is based upon the above findings.

A method of manufacturing a powder of a Bi-based superconductive oxide containing Pb according to a first aspect of the invention will be explained below. The first aspect is based upon the above finding (1).

i) First, a powder of $CaCO_3$, a powder of $SrCO_3$, a powder of CuO, a powder of $Bi_2O_3$, and a powder of PbO are prepared as starting powders.

ii) Of these starting powders, the $CaCO_3$ powder, the $SrCO_3$ powder, and the CuO powder are mixed in predetermined proportions, and the mixed powder is sintered in an oxidation atmosphere at a predetermined temperature and under atmospheric pressure into a sintered body of a Ca—Sr—Cu—O oxide. The Ca—Sr—Cu—O oxide sintered body is crushed into a Ca—Sr—Cu—O oxide powder.

iii) Then, the $Bi_2O_3$ powder and the PbO powder are mixed in predetermined proportions, and the mixed powder is subjected to sintering in an oxidation atmosphere at a predetermined temperature and under atmospheric pressure into a sintered body of a Bi—Pb—O oxide. The Bi—Pb—O oxide sintered body is crushed into a Bi—Pb—O oxide powder.

iv) Then, the Ca—Sr—Cu—O oxide powder and the Bi—Pb—O oxide powder are mixed in predetermined proportions, and the mixed powder is subjected to sintering in an oxidation atmosphere at a predetermined temperature and under atmospheric pressure into a sintered body of a Bi-based superconductive oxide containing Pb. The sintered body is crushed into a powder.

The predetermined sintering temperature in the step ii) is preferably within a range from 850° to 1050° C. If the sintering temperature is lower than 850° C., the carbonates in the mixed powder are not discomposed to a sufficient degree, so that a large amount of residual carbon will be present in the resulting sintered body, which causes degradation in the superconductivity of the superconductive oxide sintered body. On the other hand, if the sintering temperature is higher than 1050° C., the CuO tends to melt during sintering, which makes it impossible to obtain a Ca—Sr—Cu—O oxide sintered body having a homogeneous structure.

The predetermined sintering temperature in the step iii) is preferably within a range from 500° to 670° C. If the sintering temperature is lower than 500° C., formation of a Bi—Pb—O oxide and sufficient dispersion of Pb in Bi are not assured. On the other hand, if the sintering temperature is higher than 670° C., there can occur local melting of the mixed powder and sublimation of PbO during sintering so that a Bi—Pb—O oxide sintered body having a desired chemical composition will not be formed. If the Bi—Pb—O oxide which is obtained by reaction between $Bi_2O_3$ and PbO during sintering is in the form of a complete composite oxide of $Bi_2O_3$ and PbO, such as $6Bi_2O_3$—PbO, $4Bi_2O_3$—5PbO, almost no sublimation of PbO takes place. On the contrary, if the Bi—Pb—O oxide has a pure PbO phase, sublimation of PbO is apt to take place. Therefore, the Bi—Pb—O oxide must not have a pure PbO phase.

The predetermined sintering temperature in the step iv) for the first sintering is preferably within a range from 500° to 670° C. If the sintering temperature is lower than 500° C., reaction between the oxide powders will not take place to a satisfactory degree during sintering. On the other hand, if the sintering temperature is higher than 670° C., there occurs local melting of the powders during sintering, thereby making the structure of the resulting sintered body inhomogeneous. If the sintering of the step iv) is effected within the predetermined sintering temperature so that sufficient dispersion of elements takes place, a subsequent sintering, hereinafter described, can be carried out at an elevated temperature close to the melting point of the Bi—Sr—Ca—Cu—O oxide, i.e., up to 890° C.

The powder of the Bi—Pb—Sr—Cu—O superconductive oxide obtained in the step iv) according to the first aspect of the invention may be compacted by pressing into a green compact, followed by sintering the green compact in an oxidation atmosphere at a predetermined temperature and under atmospheric pressure into a sintered body of the Bi-based superconductive oxide containing Pb.

The predetermined temperature is preferably within a range from 500° to 890° C. If the sintering temperature is lower than 500° C., the powder is not satisfactorily reacted during sintering. On the other hand, if the sintering temperature is higher than 890° C., which is higher than the melting point of the Bi-based oxide, there occurs local melting during sintering so that the resulting sintered body will have an inhomogenous structure.

Alternatively, a powder of the Bi—Pb—Sr—Ca—Cu—O superconductive oxide obtained in the step iv) may also be hot pressed into a sintered body of the Bi—Pb—Sr—Ca—Cu—O superconductive oxide at the above predetermined temperature, i.e., 500° to 890° C.

Further, a sintered body of the Bi—Pb—Sr—Ca—Cu—O superconductive oxide may also obtained by mixing the Ca—Sr—Cu—O oxide powder and the Bi—Pb—O oxide powder, each of which has been obtained through the manufacture of the powder of the Bi—Pb—Sr—Ca—Cu—O superconductive oxide, in predetermined proportions, and hot pressing the mixed powder at a predetermined temperature within the range from 400° to 670° C.

According to the second aspect of the invention, a sintered body of a Bi-based superconductive oxide containing Pb is also obtained by sintering or hot pressing a conventional Bi—Sr—Ca—Cu—O oxide powder at a lower temperature than that in the conventional method, in the following manner:

First, a powder of a Bi—Sr—Ca—Cu—O oxide having a substantially superconductive chemical composition is prepared as a starting powder.

Then, a powder of a composite $PbO$-$Bi_2O_3$ oxide having a PbO content of 60° to 80° molar percent is mixed with the prepared Bi-based oxide powder, and the mixed powder is compacted into a green compact, followed by sintering in an oxidation atmosphere at a predetermined temperature and under atmospheric pressure. Alternatively, the mixed powder is hot pressed into a sintered body of the Bi-based superconductive oxide containing Pb.

The above powder of a Bi—Sr—Ca—Cu—O oxide powder having a substantially superconductive chemical composition may be a conventional Bi—Sr—Ca—Cu—O oxide superconductive powder, or a Bi—Sr—Ca—Cu—O oxide superconductive powder having a little smaller Bi content than the former.

The composite oxide of $PbO$-$Bi_2O_3$ is formed of a eutectic of PbO and $Bi_2O_3$, which presents a liquid phase at a low sintering temperature and serves as a sintering assistant to accelerate liquid-phase sintering, thereby ensuring formation of a sintered body with high density by sintering at a low temperature. Therefore, the resulting sintered body has a low degree of oxygen deficiency, requiring no oxygen annealing or oxygen annealing only for a short time period.

If the composite $PbO$-$Bi_2O_3$ oxide has a chemical composition corresponding to its eutectic point, i.e., PbO: 73 molar percent and $Bi_2O_3$: 27 molar percent, it has the lowest melting point of 635° C. and is most suitable as a sintering assistant.

If the PbO content is lower than 60 molar percent or higher than 80 molar percent, the composite $PbO$-$Bi_2O_3$ oxide has a melting point higher than 700° C. and cannot satisfactorily act as a sintering assistant at a low sintering temperature, thereby making it impossible to obtain a sintered body having satisfactorily high density. Therefore, the PbO content of the composite $PbO$-$Bi_2O_3$ oxide has been limited within a range from 60 to 80 molar percent.

Examples of the methods according to the invention will now be described in detail.

EXAMPLE 1

First, a powder of $Bi_2O_3$, a powder of PbO, a powder of $SrCO_3$, a powder of $CaCO_3$, and a powder of CuO, each having a mean particle size of 10 microns, were prepared as starting powders. Of these powders, the $SrCO_3$ powder, the $CaCO_3$ powder, and CuO powder were mixed in the following proportions:

$SrCO_3$ Powder: 116.0 g
$CaCO_3$ Powder: 78.5 g
CuO Powder: 125.0 g.

The mixed powder and hexane as a solvent were mixed by a ball mill for 3 hours, and dried, followed by sintering in a flowing oxygen atmosphere at a temperature of 900° C. for 5 hours to obtain a sintered powder. The sintered powder was crushed by a ball mill into a crushed powder, which was again sintered in a flowing oxygen atmosphere at a temperature of 900° C. for 5 hours to obtain a sintered powder. The sintered powder was finely crushed into a powder of Ca—Sr—Cu—O oxide having a smaller mean particle size of 7 microns or less. The amount of residual carbon present in the Ca—Sr—Cu—O oxide powder was measured and found to be 0.1 by weight % or less.

Then, the $Bi_2O_3$ powder and the PbO powder were mixed in proportions of $Bi_2O_3$ powder: 113.5 g and PbO powder: 66.5 g, and the mixed was mixed by a wet-type ball mill for 3 hours. The mixed powder was charged into a crucible formed of platinum, and sintered in a flowing oxygen atmosphere at a temperature of 550° C. for 1 hour into a sintered powder. The sintered powder was crushed by a ball mill, and the crushed powder was further sintered in a flowing oxygen atmosphere at a temperature of 550° C. for 1 hour. The sintered powder was finely crushed by a ball mill into a powder of Bi—Pb—O oxide having a mean particle size of 10 microns or less. The Bi—Pb—O oxide powder was subjected to X-ray diffraction analysis to recognize the presence of a phase of composite $4Bi_2O_3 \cdot 5PbO$ oxide in the Bi—Pb—O oxide powder.

The Ca—Sr—Cu—O oxide powder and the Bi—Pb—O oxide powder were mixed by a ball mill into a mixed powder. The mixed powder was sintered in an oxygen atmosphere at a temperature of 550° C. for 20 hours into a sintered powder. The sintered powder was crushed by a ball mill, and the crushed powder was sintered in an oxygen atmosphere at a temperature of 650° C. for 20 hours, followed by being finely crushed by a ball mill into a powder of Bi—Pb—Sr—Ca—Cu—O oxide having a mean particle size of 6 microns.

By using the Sr—Ca—Cu—O oxide powder, the Bi—Pb—O oxide powder, and the the Bi—Pb—Sr—Ca—Cu—O superconductive oxide powder obtained as above, sintered bodies were formed in accordance with the following methods:

Sintered Body Forming Method (1)

The Bi—Pb—Sr—Ca—Cu—O superconductive oxide powder was compacted under a pressure of 3 tons/cm$^3$ into a green compact in the form of a rectangular parallelopiped having a size of 10 mm in depth, 30 mm in width, and 5 mm in height. The green compact was heat-treated in an oxidation atmosphere at a temperature of 840° C. for 50 hours.

Sintered Body Forming Method (2)

The Bi—Pb—Sr—Ca—Cu—O superconductive oxide powder was hot pressed at a temperature of 700° C. under a pressure of 150 kgf/cm$^2$ for 3 hours into a sintered body in the form of a disc having a size of 30 mm in diameter and 5 mm in height. The sintered body was heat-treated in an oxidation atmosphere at a temperature of 840° C. for 30 hours.

Sintered Body Forming Method (3)

The Ca—Sr—Cu—O oxide powder and the Bi—Pb—O oxide powder were mixed in proportions of Ca—Sr—Cu—O oxide powder: 58 g and Bi—Pb—O oxide powder: 42 g, and the mixed powder was mixed by a ball mill. The mixed powder was hot pressed at a temperature of 600° C. under a pressure of 150 kgf/cm$^2$ for 4 hours into a sintered body in the form of a disc having a size of 30 mm in diameter and 5 mm in height. The sintered body was further heat-treated in an oxidation atmosphere at a temperature of 830° C. for 30 hours.

Respective sintered bodies $1_1$-$1_3$ according to the present invention, which were obtained by the sintered body forming methods (1)-(3), were measured in respect of carbon content, density, and critical electric current density Jc and critical temperature Tc by means of a four probe method. The results of the measurements are shown in Table 1.

COMPARATIVE EXAMPLE 1

The same powders, i.e., $SrCO_3$, $CaCO_3$, CuO, $Bi_2O_3$, and PbO as those in Example 1 were prepared as starting powders, and all the powders were mixed in the same proportions as in Example 1 into a mixed powder. The mixed powder was charged into a ball mill at one time and mixed by the ball mill for 3 hours. The mixed powder was sintered in a flowing oxygen atmosphere at a temperature of 550° C. for 10 hours, followed by being crushed into a sintered powder. The sintered powder was again sintered in an oxygen atmosphere at a temperature of 650° C. for 10 hours, followed by being crushed into a sintered powder. The sintered powder was further sintered in an oxygen atmosphere at a temperature of 750° C. for 5 hours, followed by being finely crushed into a powder of Bi—Pb—Sr—Ca—Cu—O superconductive oxide having a mean particle size of 7 microns.

The amount of residual carbon present in the Bi—Pb—Sr—Ca—Cu—O superconductive oxide powder was measured, and found to be 1.5% by weight.

EXAMPLE 2

A powder of $SrCO_3$, a powder of $CaCO_3$, and a powder of CuO, which are the same powders as those in Example 1, were prepared as starting powders and mixed in the following proportions:

$SrCO_3$ Powder: 123.5 g
$CaCO_3$ Powder: 84.0 g
CuO Powder: 100.0 g.

The mixed powder was mixed together with hexane by a ball mill for 3 hours, followed by being dried. The mixed powder was sintered under the same conditions as those in Example 1, followed by being crushed into a

TABLE 1

| | METHOD OF MANUFACTURING Bi-BASED SUPERCONDUCTIVE OXIDE CONTAINING Pb | CARBON CONTENT (WEIGHT %) | DENSITY (g/cm$^3$) | SUPERCONDUCTIVITY CRITICAL ELECTRIC CURRENT DENSITY (A/cm$^2$) |
|---|---|---|---|---|
| EXAMPLE 1 $l_1$ | SINTERED BODY OBTAINED BY SINTERING GREEN COMPACT OF Bi—Pb—Sr—Ca—Cu—O SUPERCONDUCTIVE OXIDE POWDER ACCORDING TO THE INVENTION | <0.1 | 4.7 | 68 |
| $l_2$ | SINTERED BODY OBTAINED BY HOT PRESSING Bi—Pb—Sr—Ca—Cu—O SUPERCONDUCTIVE OXIDE POWDER ACCORDING TO THE INVENTION | 0.1 | 5.5 | 72 |
| $l_3$ | SINTERED BODY OBTAINED BY HOT PRESSING MIXED POWDER OF Ca—Sr—Cu—O OXIDE POWDER AND Bi—Pb—O OXIDE POWDER | 0.1 | 5.0 | 48 |
| COMPARATIVE EXAMPLE 1 | COMPARATIVE SINTERED BODY OBTAINED BY SINTERING CONVENTIONAL Bi—Pb—Sr—Ca—Cu—O SUPERCONDUCTIVE OXIDE POWDER | 1.5 | 4.5 | 1.5 |

| | METHOD OF MANUFACTURING Bi-BASED SUPERCONDUCTIVE OXIDE CONTAINING Pb | SUPERCONDUCTIVITY CRITICAL TEMPERATURE Tc (°K.) | |
|---|---|---|---|
| | | AT WHICH RESISTANCE VALUE BECOMES ZERO | AT WHICH RESISTANCE VALUE MARKEDLY CHANGES |
| EXAMPLE 1 $l_1$ | SINTERED BODY OBTAINED BY SINTERING GREEN COMPACT OF Bi—Pb—Sr—Ca—Cu—O SUPERCONDUCTIVE OXIDE POWDER ACCORDING TO THE INVENTION | 100 | 115 |
| $l_2$ | SINTERED BODY OBTAINED BY HOT PRESSING Bi—Pb—Sr—Ca—Cu—O SUPERCONDUCTIVE OXIDE POWDER ACCORDING TO THE INVENTION | 102 | 110 |
| $l_3$ | SINTERED BODY OBTAINED BY HOT PRESSING MIXED POWDER OF Ca—Sr—Cu—O OXIDE POWDER AND Bi—Pb—O OXIDE POWDER | 100 | 108 |
| COMPARATIVE EXAMPLE 1 | COMPARATIVE SINTERED BODY OBTAINED BY SINTERING CONVENTIONAL Bi—Pb—Sr—Ca—Cu—O SUPERCONDUCTIVE OXIDE POWDER | 75 | 110 |

The obtained Bi—Pb—Sr—Ca—Cu—O superconductive oxide powder was compacted into a green compact under the same conditions as these in Method (1) of Example 1. The green compact was heat treated and sintered under the same conditions as those in Method (1) of Example 1, to obtain a comparative sintered body 1.

The comparative sintered body 1 was measured in respect of carbon content, density, and critical electric current density Jc and critical temperature Tc. The measurement results are shown in Table 1.

powder of Ca—Sr—Cu—O oxide having a mean particle size of 7 microns.

Then, a $Bi_2O_3$ powder and a PbO powder, which are the same powders as those in Example 1, were mixed in proportions of $Bi_2O_3$ powder: 136.5 g and PbO powder: 56.5 g, and the mixed powder was sintered under the same conditions as those in Example 1, followed by being crushed into a powder of Bi—Pb—O oxide having a mean particle size of 10 microns.

The Bi—Pb—O oxide powder was subjected to X-ray diffraction analysis to recognize the presence of a phase of composite $4Bi_2O_3\text{-}5PbO$ oxide in the Bi—Pb—O oxide.

The Ca—Sr—Cu—O oxide powder and the Bi—Pb—O oxide powder were mixed by a ball mill into a mixed powder. The mixed powder was sintered under the same conditions as those in Example 1, followed by being crushed into a powder of Bi—Pb—Sr—Ca—Cu—O superconductive oxide having a mean particle size of 6 microns.

By using the Ca—Sr—Cu—O oxide powder, the Bi—Pb—O oxide powder, and the Bi—Pb—Sr—Ca—Cu—O superconductive oxide powder obtained as above, respective sintered bodies were formed in accordance with Methods (1)-(3) of Example 1 to obtain sintered bodies $2_1$-$2_3$ according to the present invention.

The sintered bodies $2_1$-$2_3$ according to the present invention were each measured in respect of carbon content, density, and critical electric current density Jc and critical temperature Tc. The results of the measurements are shown in Table 2.

COMPARATIVE EXAMPLE 2

The same powders, i.e., $SrCO_3$, $CaCO_3$, CuO, $Bi_2O_3$, and PbO as those in Example 2 were prepared as starting powders. All the powders were mixed in the same proportions as those in Example 2, into a mixed powder. The mixed powder was mixed and heat-treated in the same manner as Example 1 into a powder of Bi—Pb—Sr—Ca—Cu—O superconductive oxide having a mean particle size of 7 microns.

The Bi—Sr—Ca—Cu—O superconductive oxide powder was sintered under the same conditions as those in Comparative Example 1 (in accordance with the Sintered Body Forming Method (1) in Example 1) into a comparative sintered body 2.

The comparative sintered body 2 was measured in respect of carbon content, density, and critical electric current density Jc and critical temperature Tc. The results of the measurements are shown in Table 2.

EXAMPLE 3

A Ca—Sr—Cu—O oxide powder was prepared in the same manner as Example 1 by using a $SrCO_3$ powder, a $CaCO_3$ powder, and a CuO powder in the following proportions:

$SrCO_3$ Powder: 115.5 g
$CaCO_3$ Powder: 78.5 g

TABLE 2

| | METHOD OF MANUFACTURING Bi-BASED SUPERCONDUCTIVE OXIDE CONTAINING Pb | CARBON CONTENT (WEIGHT %) | DENSITY (g/cm$^3$) | SUPERCONDUCTIVITY CRITICAL ELECTRIC CURRENT DENSITY (A/cm$^2$) |
|---|---|---|---|---|
| EXAMPLE 2 $2_1$ | SINTERED BODY OBTAINED BY SINTERING GREEN COMPACT OF Bi—Pb—Sr—Ca—Cu—O SUPERCONDUCTIVE OXIDE POWDER ACCORDING TO THE INVENTION | <0.1 | 4.7 | 61 |
| $2_2$ | SINTERED BODY OBTAINED BY HOT PRESSING Bi—Pb—Sr—Ca—Cu—O SUPERCONDUCTIVE OXIDE POWDER ACCORDING TO THE INVENTION | 0.1 | 5.5 | 39 |
| $2_3$ | SINTERED BODY OBTAINED BY HOT PRESSING MIXED POWDER OF Ca—Sr—Cu—O OXIDE POWDER AND Bi—Pb—O OXIDE POWDER | 0.1 | 5.0 | 34 |
| COMPARATIVE EXAMPLE 2 | COMPARATIVE SINTERED BODY OBTAINED BY SINTERING CONVENTIONAL Bi—Pb—Sr—Ca—Cu—O SUPERCONDUCTIVE OXIDE POWDER | 2.0 | 4.5 | 2.8 |

| | METHOD OF MANUFACTURING Bi-BASED SUPERCONDUCTIVE OXIDE CONTAINING Pb | SUPERCONDUCTIVITY CRITICAL TEMPERATURE Tc (°K.) AT WHICH RESISTANCE VALUE BECOMES ZERO | AT WHICH RESISTANCE VALUE MARKEDLY CHANGES |
|---|---|---|---|
| EXAMPLE 2 $2_1$ | SINTERED BODY OBTAINED BY SINTERING GREEN COMPACT OF Bi—Pb—Sr—Ca—Cu—O SUPERCONDUCTIVE OXIDE POWDER ACCORDING TO THE INVENTION | 105 | 115 |
| $2_2$ | SINTERED BODY OBTAINED BY HOT PRESSING Bi—Pb—Sr—Ca—Cu—O SUPERCONDUCTIVE OXIDE POWDER ACCORDING TO THE INVENTION | 103 | 112 |
| $2_3$ | SINTERED BODY OBTAINED BY HOT PRESSING MIXED POWDER OF Ca—Sr—Cu—O OXIDE POWDER AND Bi—Pb—O OXIDE POWDER | 102 | 111 |
| COMPARATIVE EXAMPLE 2 | COMPARATIVE SINTERED BODY OBTAINED BY SINTERING CONVENTIONAL Bi—Pb—Sr—Ca—Cu—O SUPERCONDUCTIVE OXIDE POWDER | 78 | 114 |

CuO Powder: 125.0 g.

Then, a Bi—Pb—O oxide powder was prepared in the same manner as Example 1 by using a $Bi_2O_3$ powder and a PbO powder in proportions of $Bi_2O_3$ powder: 146 g and PbO powder: 35.0 g Further, a powder of Bi—Pb—Sr—Ca—Cu—O superconductive oxide was prepared in the same manner as Example 1 by using the obtained Ca—Sr—Cu—O oxide powder and Bi—Pb—O oxide powder.

By using the obtained Ca—Sr—Cu—O powder, Bi—Pb—O oxide powder, and Bi—Pb—Sr—Ca—Cu—O superconductive oxide powder, respective sintered bodies were formed in accordance with the Sintered Body Forming Methods (1)-(3) in Example 1 to obtain sintered bodies $3_1$-$3_3$ according to the present invention.

ing powders, and mixed in the same proportions as those in Example 3. Based on the powders, a comparative sintered body 3 was formed in the same manner as Comparative Example 1.

The comparative sintered body 3 was measured in respect of carbon content, density, and critical electric current density Jc and critical temperature Tc. The measurement results are shown in Table 3.

As can be seen in Tables 1 to 3 the sintered bodies $1_1$-$1_3$, $2_1$-$2_3$, $3_1$-$3_3$ of the Bi-based superconductive oxides containing Pb according to the present invention each have a lower carbon content, higher density, and hence higher critical electric current density than the respective corresponding comparative sintered body 1-3, and each have a high temperature phase alone.

TABLE 3

| | METHOD OF MANUFACTURING Bi-BASED SUPERCONDUCTIVE OXIDE CONTAINING Pb | CARBON CONTENT (WEIGHT %) | DENSITY ($g/cm^3$) | SUPERCONDUCTIVITY CRITICAL ELECTRIC CURRENT DENSITY ($A/cm^2$) |
|---|---|---|---|---|
| EXAMPLE 3 $3_1$ | SINTERED BODY OBTAINED BY SINTERING GREEN COMPACT OF Bi—Pb—Sr—Ca—Cu—O SUPERCONDUCTIVE OXIDE POWDER ACCORDING TO THE INVENTION | <0.1 | 4.6 | 53 |
| $3_2$ | SINTERED BODY OBTAINED BY HOT PRESSING Bi—Pb—Sr—Ca—Cu—O SUPERCONDUCTIVE OXIDE POWDER ACCORDING TO THE INVENTION | 0.1 | 5.7 | 46 |
| $3_3$ | SINTERED BODY OBTAINED BY HOT PRESSING MIXED POWDER OF Ca—Sr—Cu—O OXIDE POWDER AND Bi—Pb—O OXIDE POWDER | 0.1 | 4.9 | 37 |
| COMPARATIVE EXAMPLE 3 | COMPARATIVE SINTERED BODY OBTAINED BY SINTERING CONVENTIONAL Bi—Pb—Sr—Ca—Cu—O SUPERCONDUCTIVE OXIDE POWER | 2.0 | 4.4 | 2.7 |

| | METHOD OF MANUFACTURING Bi-BASED SUPERCONDUCTIVE OXIDE CONTAINING Pb | SUPERCONDUCTIVITY CRITICAL TEMPERATURE Tc (°K.) | |
|---|---|---|---|
| | | AT WHICH RESISTANCE VALUE BECOMES ZERO | AT WHICH RESISTANCE VALUE MARKEDLY CHANGES |
| EXAMPLE 3 $3_1$ | SINTERED BODY OBTAINED BY SINTERING GREEN COMPACT OF Bi—Pb—Sr—Ca—Cu—O SUPERCONDUCTIVE OXIDE POWDER ACCORDING TO THE INVENTION | 99 | 113 |
| $3_2$ | SINTERED BODY OBTAINED BY HOT PRESSING Bi—Pb—Sr—Ca—Cu—O SUPERCONDUCTIVE OXIDE POWDER ACCORDING TO THE INVENTION | 100 | 110 |
| $3_3$ | SINTERED BODY OBTAINED BY HOT PRESSING MIXED POWDER OF Ca—Sr—Cu—O OXIDE POWDER AND Bi—Pb—O OXIDE POWDER | 98 | 110 |
| COMPARATIVE EXAMPLE 3 | COMPARATIVE SINTERED BODY OBTAINED BY SINTERING CONVENTIONAL Bi—Pb—Sr—Ca—Cu—O SUPERCONDUCTIVE OXIDE POWDER | 81 | 112 |

The sintered bodies $3_1$-$3_3$ according to the present invention were each measured in respect of carbon content, density, and critical electric current density Jc and critical temperature Tc. The results of the measurements are shown in Table 3.

COMPARATIVE EXAMPLE 3

The same powders, i.e., $SrCO_3$, $CaCO_3$, CuO, $Bi_2O_3$, and PbO as those in Example 3 were prepared as start-

EXAMPLE 4

A powder of $CaCO_3$, a powder of $SrCO_3$, a powder of CuO, and $Bi_2O_3$, each having a mean particle size of 7 microns, were prepared as starting powders and mixed in the following proportions by weight percent:

$CaCO_3$ Powder: 16.7 %
$SrCO_3$ Powder: 24.6 %

CuO Powder: 19.9 %
$Bi_2O_3$ Powder: 38.8 %.

The powders were mixed by a wet-type ball mill for 3 hours into a mixed powder, followed by being dried. The mixed powder was heat-treated in an oxidation atmosphere at a temperature of 700° C. for 10 hours, followed by being crushed. Further, the crushed powder was heat-treated in an air atmosphere at a temperature of 800° C. for 10 hours, followed by being crushed. This last cycle of heat-treatment and crushing was repeated five times for full dispersion of elements, followed by being finely crushed into a powder of a conventional Bi—Sr—Ca—Cu—O oxide having a composition of $Bi_{1.0}Sr_{1.0}Ca_{1.0}Cu_{1.5}O_5$ and having a mean particle size of 10 microns.

Then the $Bi_2O_3$ powder and a PbO powder having a mean particle size of 7 microns were mixed in proportions by weight percent of $Bi_2O_3$ powder: 41.1 % and PbO powder: 58.9 %, to be mixed by a wet-type ball mill for 3 hours. The mixed powder was then dried and heat-treated in a crucible formed of platinum in an oxidation atmosphere at a temperature of 600° C. for 3 hours, followed by being finely crushed into a powder. The crushed powder was heat-treated in an oxidation atmosphere at a temperature of 600° C. for 3 hour for full dispersion of elements, followed by being crushed by a ball mill into a powder of Bi—Pb—O oxide having a composition of $Bi_2O_3$-3PbO and having a mean particle size of 10 microns.

The obtained Bi-Pb-O oxide powder was added to the obtained Bi—Sr—Ca—Cu—O oxide powder in an amount of 10 % by weight (with respect to the latter being 100 %) and mixed to a sufficient degree by a wet-type ball mill, followed by being dried. The mixed powder was compacted by pressing with a uniaxial press at a pressure of 3 tons/cm² into a green compact having a size of 30 mm in length, 5 mm in width, and 10 mm in height with a density of 2.9 g/cm³ The green compact was sintered at a temperature of 640° C. under atmospheric pressure for 24 hours to obtain a sintered body 4 of Bi-based superconductive oxide containing Pb according to the present invention, which has a density of 5.2 g/cm³.

The sintered body 4 according to the present invention was measured in respect of carbon content, density, and critical electric current density Jc and critical temperature Tc by means of the four probe method. The results of the measurements are shown in Table 4.

COMPARATIVE EXAMPLE 4

A powder of $CaCO_3$, a powder of $SrCO_3$, a powder of CuO, a powder of $Bi_2O_3$, and a powder of PbO, each having a mean particle size of 7 microns, were prepared as starting powders and mixed in the following proportions by weight percent:
$CaCO_3$ Powder: 15.2 %
$SrCO_3$ Powder: 22.4 %
CuO Powder: 18.1 %
$Bi_2O_3$ Powder: 39.0 %
PbO Powder: 5.4 %.

The powders were mixed at one time by a wet-type ball mill for 3 hours into a mixed powder. The mixed powder was dried and heat-treated in an oxidation atmosphere at a temperature of 700° C. for 10 hours, followed by being crushed. The crushed powder was heat-treated in an oxidation atmosphere at a temperature of 800° C. for 10 hours, followed by being crushed. This last cycle of heat-treatment and crushing was repeated five times for full dispersion of elements, followed by being finely crushed into a powder of a conventional Bi—Pb—Sr—Ca—Cu—O oxide formed of $Bi_{1.0}Sr_{1.16}Ca_{1.0}Cu_{1.5}O_{5+x}$ and having a mean particle size of 10 microns.

The obtained Bi—Pb—Sr—Ca—Cu—O superconductive oxide powder was compacted by pressing under the same conditions as those in Example 4 into a green compact having a density of 3.0 g/cm³. The green compact was sintered under atmosheric pressure under the same conditions as those in Example 4 into a sintered body. The sintered body was oxygen annealed in an oxygen atmosphere to obtain a comparative sintered body 4.

The comparative sintered body 4 was measured in respect of carbon content, density, and critical electric current density Jc and critical temperature Tc. The measurement results are shown in Table 4.

EXAMPLE 5

The Bi—Pb—O oxide powder having the composition of $Bi_2O_3$-3PbO, which is the same powder as one prepared in Example 4, was added to the Bi—Sr—Ca—Cu—O oxide powder having the chemical composition of $Bi_{1.0}Sr_{1.0}Ca_{1.0}Cu_{1.5}O_5$, which is the same powder as one prepared in Example 4, in an amount of 20 % by weight (with respect to the latter being 100 %), to be mixed by a wet-type ball mill, followed by being dried. The mixed powder was hot pressed under a pressure of 3.0 tons/cm² in an oxidation atmosphere at a temperature of 640 C. for 5 hours into a sintered body 5 of Bi-based superconductive oxide containing Pb according to the present invention.

The sintered body 5 according to the present invention was measured in respect of carbon content, density, and critical electric current density Jc and critical temperature Tc. The results of the measurements are shown in Table 4.

COMPARATIVE EXAMPLE 5

A powder of a Bi—Pb—Sr—Ca—Cu—O superconductive oxide having a chemical composition of $Bi_{1.33}Pb_{0.29}Sr_{1.0}Ca_{1.0}Cu_{1.5}O_{5+x}$ was prepared in the same manner as Comparative Example 4. The Bi—Pb—Sr—Ca—Cu—O superconductive oxide powder Pb was hot pressed under the same conditions as those in Example 5 into a sintered body of Bi-based superconductive oxide containing Pb. The sintered body was oxygen annealed in an oxygen atmosphere into a comparative sintered body 5.

The comparative sintered body 5 was measured in respect of carbon content, density, and critical electric current density Jc and critical temperature Tc. The measuring results are shown in Table 4.

EXAMPLE 6

TABLE 4

| | SINTERED BODY FORMING METHOD | OXIDE POWDER USED | PROPERTIES OF SINTERED BODY |||
|---|---|---|---|---|---|
| | | | | SUPERCOUNDUCTIVITY ||
| | | | DENSITY ($g/cm^3$) | CRITICAL ELECTRIC CURRENT DENSITY Jc ($A/cm^2$) | CRITICAL TEMPERATURE Tc (°K.) |
| EXAMPLE 4 | ATMOSPHERIC PRESSURE SINTERING | MIXED POWDER OF $Bi_{1.0}Sr_{1.0}Ca_{1.0}Cu_{1.5}O_5$ OXIDE POWDER MIXED WITH Bi—Pb—O OXIDE POWDER IN AMOUNT 10% BY WEIGHT (WITH RESPECT TO THE FORMER BEING 100%) | 5.2 | 43 | 98 |
| COMPARATIVE EXAMPLE 4 | | POWDER OF $Bi_{1.10}Pb_{0.16}Sr_{1.0}Ca_{1.0}Cu_{1.5}O_{5+x}$ | 4.5 | 7 | 99 |
| EXAMPLE 5 | HOT PRESSING | MIXED POWDER OF $Bi_{1.0}Sr_{1.0}Ca_{1.0}Cu_{1.5}O_5$ OXIDE POWDER MIXED WITH Bi—Pb—O OXIDE POWDER IN AMOUNT 20% BY WEIGHT (WITH RESPECT TO THE FORMER BEING 100%) | 5.7 | 38 | 97 |
| COMPARATIVE EXAMPLE 5 | | POWDER OF $Bi_{1.33}Pb_{0.29}Sr_{1.0}Ca_{1.0}Cu_{1.5}O_{5+x}$ | 5.3 | 5 | 98 |

A powder of $BiO_{1.5}$, the powder of $SrCO_3$, the powder of $CaCO_3$, and the powder of CuO were mixed in proportions by weight percent of $BiO_{1.5}$: 36.4 %, $SrCO_3$: 23.1 %, $CaCO_3$: 15.6 %, and CuO: 24.9 %. The mixed powder was formed in the same manner as Example 4 into a Bi—Sr—Ca—Cu—O oxide powder having a composition of $Bi_{1.0}Sr_{1.0}Ca_{1.0}Ca_{1.0}Cu_{2.0}O_{5.5}$ and having a mean particle size of 8 microns.

Then, the Bi—Pb—O oxide powder having the composition of $Bi_2O_3$-3PbO which was prepared in Example 4, was added to the above Bi—Sr—Ca—Cu—O oxide powder in an amount of 10% by weight (with respect to the latter being 100%) into a mixed powder. The mixed powder was compacted and sintered under the same conditions as those in Example 4 into a sintered body 6 of Bi—Pb—Sr—Ca—Cu—O oxide according to the present invention.

The sintered body 6 according to the present invention was measured in respect of carbon content, density, and critical electric current density Jc and critical temperature Tc. The measurement results are shown in Table 4.

COMPARATIVE EXAMPLE 6

A powder of a Bi—Pb—Sr—Ca—Cu—O superconductive oxide, which has a composition of $Bi_{1.09}Pb_{0.13}Sr_{1.0}Ca_{1.0}Cu_{2.0}O_{6+x}$ and has a mean particle size of 10 microns, was prepared in the same manner as Comparative Example 4. The Bi—Pb—Sr—Ca—Cu—O superconductive oxide powder was compacted by pressing and sintered under the same conditions as those in Example 4 into a sintered body of Bi-based superconductive oxide containing Pb.

TABLE 5

| | SINTERED BODY FORMING METHOD | OXIDE POWDER USED | PROPERTIES OF SINTERED BODY |||
|---|---|---|---|---|---|
| | | | | SUPERCOUNDUCTIVITY ||
| | | | DENSITY ($g/cm^3$) | CRITICAL ELECTRIC CURRENT DENSITY Jc ($A/cm^2$) | CRITICAL TEMPERATURE Tc (°K.) |
| EXAMPLE 6 | ATMOSPHERIC PRESSURE SINTERING | MIXED POWDER OF $Bi_{1.0}Sr_{1.0}Ca_{1.0}Cu_{2.0}O_{5.5}$ OXIDE POWDER MIXED WITH Bi—Pb—O OXIDE POWDER IN AMOUNT 10% BY WEIGHT (WITH RESPECT TO THE FORMER BEING 100%) | 5.1 | 35 | 99 |
| COMPARATIVE EXAMPLE 6 | | POWDER OF $Bi_{1.09}Pb_{0.13}Sr_{1.0}Ca_{1.0}Cu_{2.0}O_{5+x}$ | 4.6 | 2 | 100 |
| EXAMPLE 7 | HOT PRESSING | MIXED POWDER OF $Bi_{1.0}Sr_{1.0}Ca_{1.0}Cu_{2.0}O_{5+x}$ OXIDE POWDER MIXED WITH Bi—Pb—O OXIDE POWDER IN AMOUNT 20% BY WEIGHT (WITH RESPECT TO THE FORMER BEING 100%) | 5.8 | 27 | 98 |
| COMPARATIVE EXAMPLE 7 | | POWDER OF $Bi_{1.19}Pb_{0.29}Sr_{1.0}Ca_{1.0}Cu_{2.0}O_{5+x}$ | 5.3 | 3 | 97 |

The sintered body was annealed in an oxygen atmosphere into a comparative sintered body 6.

The comparative sintered body 6 was measured in respect of carbon content, density, and critical electric current density Jc and critical temperature Tc. The results of the measurements are shown in Table 5.

EXAMPLE 7

The Bi—Pb—O oxide powder having the composition of $Bi_2O_3$-3PbO, which was prepared in Example 4, was added to the Bi—Sr—Ca—Cu—O oxide powder having the composition of $Bi_{1.0}Sr_{1.0}Ca_{1.0}Cu_{2.0}O_{5.5}$, which was prepared in Example 6, in an amount of 20 % by weight (with respect to the latter being 100 %) into a mixed powder. The mixed powder was hot pressed under the same conditions as those in Example 5 into a sintered body 7 of Bi-based oxide containing Pb according to the present invention.

The sintered body 7 of the Bi-based superconductive oxide containing Pb according to the present invention was measured in respect of carbon content, density, and critical electric current density Jc and critical temperature Tc. The results of the measurements are shown in Table 5.

COMPARATIVE EXAMPLE 7

A powder of a Bi—Pb—Sr—Ca—Cu—O superconductive oxide having a composition of $Bi_{1.19}Pb_{0.29}Sr_{1.0}Ca_{1.0}Cu_{2.0}O_{5+x}$ was prepared in the same manner as Comparative Example 4. The Bi—Pb—Sr—Ca—Cu—O superconductive oxide powder was hot pressed under the same conditions as those in Example 5, followed by being oxygen annealed in an oxygen atmosphere into a comparative sinterd body 7.

The comparative sintered body 7 was measured in respect of carbon content, density, and critical electric current density Jc and critical temperature Tc. The measuring results are shown in Table 5.

It will be noted from Tables 4 and 5 that the sintered bodies 4–7 of Bi-based superconductive oxides containing Pb according to the present invention, which have been obtained by sintering or hot pressing the mixed powder of the Bi-based oxide powder and the Bi—Pb—O oxide powder, each have higher density, and hence higher critical electric current density than the respective corresponding comparative sintered bodies 4–7, which have been obtained by sintering or hot pressing the Bi—Pb—Sr—Ca—Cu—O superconductive oxide powder. This is because the Bi—Pb—O oxide powder serves as a sintering assistant during sintering or hot pressing so that the sintered body of the Bi-based superconductive oxide containing Pb has increased density and hence higher critical electric current density, even if the sintering or hot pressing is effected at a low temperature.

Further, when the Bi-based oxide powder is sintered or hot pressed with the Bi—Pb—O oxide powder having a eutectic structure of $PbO-Bi_2O_3$ as a sintering assistant, sintering can be carried out at such a low sintering temperature that the amount of oxygen leaving the sintered body during sintering is so small that the resulting sintered body of the Bi-based superconductive oxide has high density and hence excellent super conductivity.

What is claimed is:

1. In a method of manufacturing a powder of a Bi-based superconductive oxide containing Pb from a Ca carbonate powder, a Sr carbonate powder, a Cu oxide powder, a Bi oxide powder, and a Pb oxide powder, the improvement comprising the steps of:
   (1) mixing said Ca carbonate powder, said Sr carbonate powder, and said Cu oxide powder, and sintering the resulting mixed powder at a temperature of from 850° to 1050° C. into a sintered body of a Ca—Sr—Cu—O oxide;
   (2) mixing said Bi oxide powder and said Pb oxide powder, and sintering the resulting mixed powder at a temperature of from 500° to 670° C. into a sintered body of a Bi—Pb—O oxide, wherein said Bi—Pb—O oxide is $PbO-Bi_2O_3$;
   (3) crushing said Ca—Sr—Cu—O oxide sintered body and said Bi—Pb—O oxide sintered body into a powder of said Ca—Sr—Cu—O oxide and a powder of said Bi—Pb—O oxide, respectively;
   (4) mixing said Ca—Sr—Cu—O oxide powder and said Bi—Pb—O oxide powder in proportions which when sintered will form a Bi—Pb—Sr—Ca—Cu—O superconductive oxide, and sintering the resulting mixed powder at a temperature of from 500° to 670° C. into a sintered body of a Bi—Pb—Sr—Ca—Cu—O superconductive oxide; and
   (5) crushing said Bi—Pb—Sr—Ca—Cu—O superconductive oxide sintered body into said powder of said Bi-based superconductive oxide containing Pb.

2. In a method of manufacturing a sintered body formed of a bi-based superconductive oxide containing Pb from a Ca carbonate powder, a Sr carbonate powder, a Cu oxide powder, a Bi oxide powder, and a Pb oxide powder, the improvement
   (1) mixing said Ca carbonate powder, said Sr carbonate powder, and said Cu oxide powder, and sintering the resulting mixed powder at a temperature of from 85° to 1050° C. into a sintered body of a Ca—Sr—Cu—O oxide;
   (2) mixing said Bi oxide powder and said Pb oxide powder, and sintering the resulting mixed powder at a temperature of from 500° to 670° C. into a sintered body of a Bi—Pb—O oxide, wherein said Bi—Pb—O oxide is $Pbo-Bi_2O_3$;
   (3) crushing said Ca—Sr—Cu—O oxide sintered body and said bi—Pb—O oxide sintered body into a powder of said Ca—Sr—Cu—O oxide and a powder of said Bi—Pb—O oxide, respectively;
   (4) mixing said Ca—Sr—Cu—O oxide powder and said Bi—Pb—O powder in proportions which when sintered will form a Bi—Pb—Sr—Ca—Cu—O superconductive oxide, and sintering the resulting mixed powder at a temperature of from 500° to 670° C. into a sintered body of a Bi—Pb—Sr—Ca—Cu—O superconductive oxide;
   (5) crushing said Bi—Pb—Sr—Ca—Cu—) superconductive oxide sintered body into a powder of said bi—Pb—Sr—Ca—Cu—O superconductive oxide; and
   (6) forming said Bi—Pb—Sr—Ca—Cu—O superconductive oxide powder into said sintered body of said Bi-based superconductive oxide containing Pb.

3. A method as claimed in claim 2, wherein said sintered body of said Bi-based superconductive oxide containing Pb is formed by pressing said Bi—Pb—Sr—Ca—Cu—O superconductive oxide powder into a green compact, and sintering said green compact at a temperature of from 500° to 890° C.

4. A method as claimed in claim 2, wherein said sintered body of said Bi-based superconductive oxide containing Pb is formed by hot pressing said Bi—Pb—Sr—Ca—Cu—O superconductive oxide powder.

5. In a method of manufacturing a sintered body formed of a Bi-based superconductive oxide containing Pb from a Ca carbonate powder, a Sr carbonate powder, a Cu oxide powder, a Bi oxide powder, and a Pb oxide powder, the improvement comprising the steps of:
   (1) mixing said Ca carbonate powder, said Sr carbonate powder, and said Cu oxide powder, and sintering the resulting mixed powder at a temperature of from 850° to 1050° into a sintered body of a Ca—Sr—Cu—O oxide;
   (2) mixing said Bi oxide powder and said Pb oxide powder, and sintering the resulting mixed powder at a temperature of from 500° to 670° into a sintered body of a Bi—Pb—O oxide, wherein said Bi—Pb—O oxide is $PbO-Bi_2O_3$;

(3) crushing said Ca—Sr—Cu—O oxide sintered body and said Bi—Pb—O oxide sintered body into a powder of said Ca—sr—Cu—O oxide and a powder of said Bi—Pb—O oxide respectively;

(4) mixing said Ca—Sr—Cu—O oxide powder and said Bi—Pb—O oxide powder, and hot pressing the resulting mixed powder at a temperature of from 400° to 670° C. into said sintered body of said Bi-based superconductive oxide containing Pb.

6. In a method of manufacturing a sintered body formed of a Bi-based superconductive oxide containing Pb from a Bi oxide powder, a Pb oxide powder, and a Bi—Sr—Ca—Cu—O powder, the improvement comprising the steps of:

(1) mixing said Bi oxide powder and said Pb oxide powder, and sintering the resulting mixed powder at a temperature of from 500° to 670° C. into a sintered body of a Bi—Pb—O oxide, wherein said Bi—Pb—O oxide is $PbO$-$Bi_2O_3$;

(2) crushing said Bi—Pb—O oxide sintered body into a powder, and mixing said powder with a powder of said Bi—Sr—Ca—Cu—O oxide into a mixed powder;

(3) forming said sintered body of said Bi-based superconductive oxide containing Pb from the mixed powder from (2).

7. A method as claimed in claim 6, wherein said sintered body of said Bi-based superconductive oxide containing Pb is formed by pressing the last-mentioned mixed powder into a green compact, and sintering said green compact.

8. A method as claimed in claim 6, wherein said sintered body of said Bi-based superconductive oxide containing Pb is formed by hot pressing the last-mentioned mixed powder.

9. A method as claimed in claim 6, wherein said $PbO$-$Bi_2O_3$ oxide has a PbO content from 60 to 80 molar percent.

10. A method as claimed in claim 9, wherein said $PbO$-$Bi_2O_3$ oxide has a PbO content of 73 molar percent and a $Bi_2O_3$ content of 27 molar percent.

11. The method as claimed in claim 6, wherein the Bi—Sr—Ca—Cu—O oxide has a substantially superconductive chemical composition.

12. The method as claimed in claim 1, wherein said $PbO$-$Bi_2O_3$ oxide has a PbO content from 60 to 80 molar percent.

13. The method as claimed in claim 2, wherein said $PbO$-$Bi_2O_3$ oxide has a PbO content from 60 to 80 molar percent.

14. The method as claimed in claim 6, wherein said $PbO$-$Bi_2O_3$ oxide has a PbO content from 60 to 80 molar percent.

15. The method as claimed in claim 1, wherein said $PbO$-$Bi_2O_3$ oxide has a PbO content of 73 molar percent and a $Bi_2O_3$ oxide content of 27 molar percent.

* * * * *